(12) United States Patent
Mori

(10) Patent No.: US 7,412,983 B2
(45) Date of Patent: Aug. 19, 2008

(54) PATTERN FORMING METHOD AND APPARATUS, AND DEVICE FABRICATION METHOD AND DEVICE

(75) Inventor: Yoshiaki Mori, Suwa (JP)

(73) Assignee: Seiko Epson Corporation, Tokyo (JP)

(*) Notice: Subject to any disclaimer, the term of this patent is extended or adjusted under 35 U.S.C. 154(b) by 374 days.

(21) Appl. No.: 11/155,574

(22) Filed: Jun. 20, 2005

(65) Prior Publication Data

US 2005/0241678 A1 Nov. 3, 2005

Related U.S. Application Data

(62) Division of application No. 10/368,647, filed on Feb. 20, 2003, now Pat. No. 6,977,222.

(30) Foreign Application Priority Data

Mar. 22, 2002 (JP) ............................... 2002-81214

(51) Int. Cl.
*B08B 3/02* (2006.01)
(52) U.S. Cl. .......................... 134/198; 134/902; 15/321
(58) Field of Classification Search ................. 134/198, 134/902; 15/302, 320, 321
See application file for complete search history.

(56) References Cited

U.S. PATENT DOCUMENTS 5,271,798 A * 12/1993 Sandhu et al. ............... 438/745
6,290,863 B1 * 9/2001 Morgan et al. ................ 216/73
6,329,301 B1 * 12/2001 Zahorik et al. ............... 438/745
6,365,531 B1 4/2002 Hayashi et al.
6,488,040 B1 * 12/2002 de Larios et al. ........... 134/95.2
6,550,990 B2 * 4/2003 Sakurai et al. ............... 396/604
6,599,582 B2 7/2003 Kiguchi et al.
2002/0067400 A1 6/2002 Kawase et al.

FOREIGN PATENT DOCUMENTS

| JP | 62-188322 | * | 8/1987 |
| JP | A-07-241501 | | 9/1995 |
| JP | A-08-264923 | | 10/1996 |
| JP | A 11-204529 | | 7/1999 |
| JP | A 2000-349059 | | 12/2000 |
| JP | A 2001-151345 | | 5/2001 |
| JP | A 2002-221616 | | 8/2002 |

* cited by examiner

*Primary Examiner*—Frankie L Stinson
(74) *Attorney, Agent, or Firm*—Oliff & Berridge, PLC

(57) ABSTRACT

The invention saves resources and energy. A cleaning/fluid-feeding head integrates a cleaning head portion and a fluid-feeding head portion. The cleaning head portion includes an organic substance cleaning unit, an inorganic substance cleaning unit, a rinsing unit and a drying unit. The organic substance cleaning unit, inorganic substance cleaning unit and rinsing unit selectively clean pattern forming regions on a substrate by feeding thereto a first cleaning fluid, second cleaning fluid and pure water, respectively. The drying unit dries the rinsed pattern forming regions by blowing hot air thereonto. The fluid-feeding head portion selectively feeds a liquid pattern forming material to the cleaned pattern forming regions.

6 Claims, 6 Drawing Sheets

FIG. 6
(1)
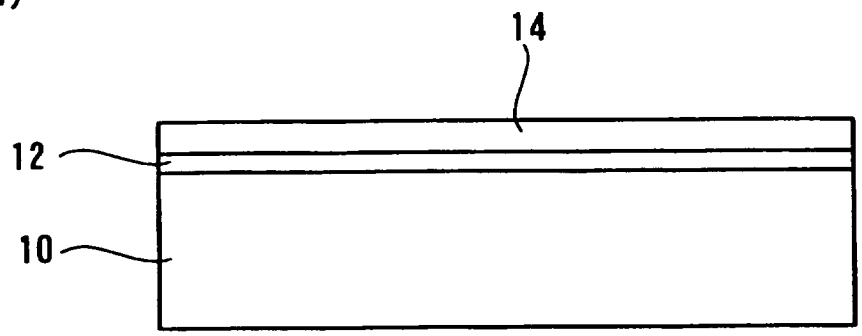
(2)
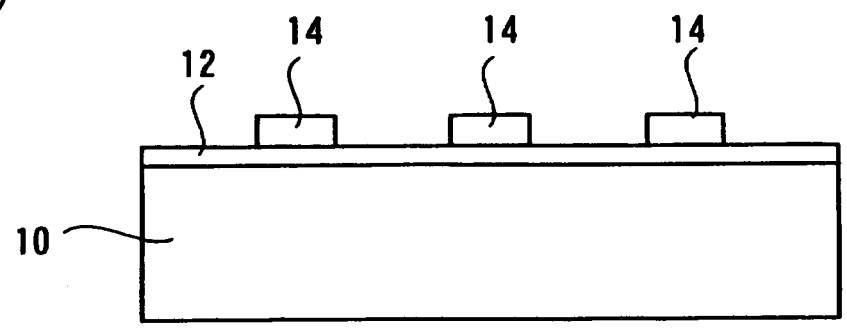
(3)
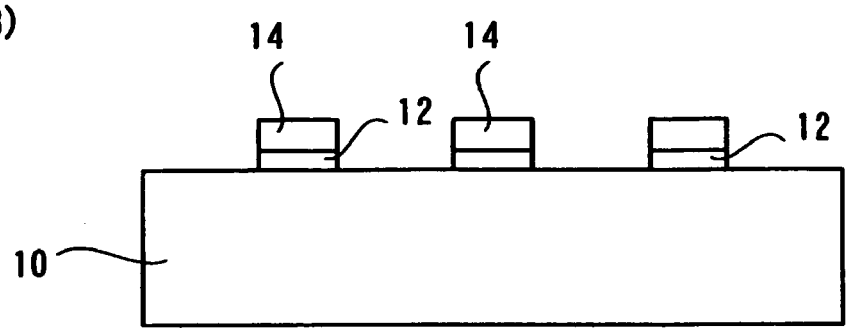
(4)
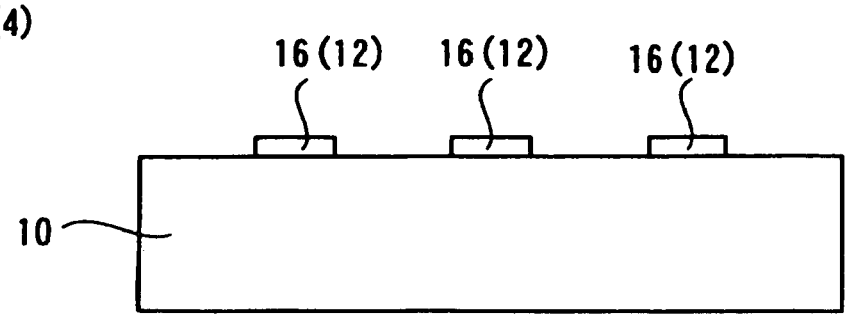

PATTERN FORMING METHOD AND APPARATUS, AND DEVICE FABRICATION METHOD AND DEVICE

CROSS-REFERENCE TO RELATED APPLICATION

This is a Divisional of application Ser. No. 10/368,647 filed Feb. 20, 2003. The entire disclosure of the prior application is hereby incorporated by reference.

BACKGROUND OF THE INVENTION

1. Field of Invention

The present invention relates to a method of forming a pattern on a semiconductor or glass substrate. More particularly, the invention relates to a pattern forming method and apparatus suitable to form a pattern using a liquid pattern forming material, and a device fabrication method and device.

2. Description of Related Art

In the fabrication of an electronic device for a semiconductor apparatus or a liquid crystal panel, a related art pattern formation is carried out as follows. In a case where a wiring pattern is formed, for example, a semiconductor or glass substrate is first immersed in a cleaning vessel to clean substrate entirely and to remove organic or inorganic contaminants adhered to surfaces of the substrate. Then, the substrate is rinsed with a rinsing fluid such as pure water, and then dried. Subsequently, the substrate thus cleaned and dried is conveyed into a vacuum chamber of a film forming apparatus, where a metal film 12 is deposited on a surface of a substrate 10 by CVD or sputtering, as shown in FIG. 6-1. A photoresist is applied to the overall surface of the metal film 12 and dried so as to form a resist film 14.

Next, the resist film 14 is subjected to light irradiation and development by photolithography, so that the resist film 14 is left only on an area to define the wiring pattern, while the metal film 12 is exposed on an area where the wiring pattern is not formed (see FIG. 6-2). Subsequently, the substrate 10 is conveyed into a plasma etching apparatus wherein the metal film 12 is etched away using the resist film 14 as mask, thereby selectively removing the exposed metal film 12 to leave the metal film 12 only beneath the resist film 14, as shown in FIG. 6-3. The resist film 14 is removed by stripping by way of vacuum oxygen plasma thereby to obtain a wiring pattern 16 made of the metal film 12 as shown in FIG. 20-4.

SUMMARY OF THE INVENTION

According to the related art pattern forming method described above, the whole body of the substrate 10 is cleaned by immersing the same in the cleaning vessel in order to remove the organic or inorganic contaminants adhered to the substrate 10. The recent upsizing of the substrate entails the upsizing of the cleaning vessel and conveying machine whereas a larger quantity of cleaning fluid or rinsing fluid is required. On the other hand, the cleaning process is performed under control to maintain the cleaning fluid at a predetermined temperature in order to increase the cleaning effect of the fluid. Thus, a larger quantity of energy is required to maintain predetermined temperature of the larger quantity of cleaning fluid. Furthermore, the related art pattern forming process involves a concern that the substrate 10 thus cleaned and dried may be contaminated while it is transported from a cleaning apparatus to a pattern forming apparatus. Hence, the substrate 10 must be retained in a clean atmosphere during the transportation so as to prevent the contamination. This step is cumbersome and costly.

According to the related art pattern forming method, the pattern formation process includes the steps of placing the substrate 10 in the vacuum chamber to overlay the metal film 12 or an insulative film on the overall surface of the substrate 10 by vacuum CVD or the like; and then overlaying the resist film 14, which is used when above mentioned films are etched, on the overall surface of the metal film 12. In other words, the related art pattern forming method consumes resources more than required because the metal film 12 and the like are also formed on an area of the substrate 10, in which patterns are not formed. In addition, the related art pattern forming method requires expensive vacuum apparatuses and consumes a large quantity of energy because the film formation, etching and stripping are carried out in vacuum. Furthermore, these vacuum apparatuses are also upsized in conjunction with the upsizing of the substrate 10, resulting in increased equipment costs.

The present invention addresses or solves the above and/or other problems, and saves resources and energy.

The invention also provides a process where the cleaning of the substrate is immediately followed by the formation of a pattern forming film.

According to the invention, a pattern forming method includes: cleaning pattern forming regions on a substrate using a first group of nozzles formed at a fluid ejection device; and forming a pattern by ejecting a liquid pattern forming material onto the cleaned pattern forming regions through a second group of nozzles formed at the fluid ejection device.

In the inventive method thus arranged, the substrate is cleaned only at the regions to be formed with the pattern. Thus, the consumption of the cleaner is dramatically decreased to save resources. Since a part of the substrate is selectively cleaned, a large-sized cleaning vessel and the like are not required. This leads to the downsizing of the cleaning apparatus and the energy saving.

Furthermore, the invention is adapted to form the pattern by feeding the liquid pattern forming material to the pattern forming regions, thus reducing the consumption of the costly pattern forming material and saving resources. In addition, the invention does not use the vacuum equipment so as to decrease the equipment costs and to save energy.

A part of the substrate other than the pattern forming regions may preferably be treated to be fluid repellent. By applying the fluid-repellent treatment to the part of the substrate other than the pattern forming regions, the liquid pattern forming material is prevented from adhering to the part other than the pattern forming regions. This not only permits the pattern to be formed in a favorable configuration but also obviates a step to remove unwanted adherents. The fluid-repellent treatment may be accomplished by forming a fluid-repellent film on a surface of the substrate. The formation of the fluid-repellent film provides a reliable fluid-repellent treatment regardless of the material characteristics of the substrate.

According to the invention, a pattern forming method includes: forming a fluid-repellent film on an overall pattern-forming surface of a substrate; removing the fluid-repellent film from portions of the substrate which correspond to pattern forming regions; cleaning the pattern forming regions using a first group of nozzles formed at a fluid ejection device; and forming a pattern by ejecting a liquid pattern forming material onto the cleaned pattern forming regions through a second group of nozzles formed at the fluid ejection device.

In the inventive method thus arranged, the substrate is selectively cleaned only at the pattern forming regions, to which the liquid pattern forming material is supplied. Similarly to the above, the savings of resources and energy are achieved. According to the invention, the pattern forming regions are cleaned by use of the first group of nozzles and immediately thereafter, the second group of nozzles feeds the liquid pattern forming material onto the pattern forming regions to form the pattern. Therefore, the cleaning of the substrate is immediately followed by the formation of a pattern forming film thereon, so that the concern of contamination of the cleaned substrate is eliminated. In addition, the fluid-repellent film is formed and then removed from the portions of the substrate which correspond to the pattern forming regions. Hence, the liquid pattern forming material is prevented from adhering to the other portions than the pattern forming regions, so that the pattern may be formed with high precision.

It is preferred to carry out the cleaning step and the step of feeding the liquid pattern forming material in a continued manner. If the cleaning of the pattern forming regions is immediately and continuously followed by the feeding of the liquid cleaner, the cleaned portions are not contaminated with air-borne dusts or the like, so that labor and control for preventing the contamination of the cleaned substrate may be dispensed with. The cleaning step may include a cleaner feeding step, a rinsing-fluid feeding step and a drying step. Unwanted adherents, such as contaminants adhered on the substrate, can be positively removed by performing these steps in the cleaning process and hence, a pattern of good configuration is obtained.

The cleaner feeding step and the rinsing-fluid feeding step may preferably be carried out while sucking a cleaner and a rinsing fluid fed onto the pattern forming regions, respectively. This ensures that the pattern forming regions can be selectively cleaned in an easy and reliable manner. The drying step may be carried out by blowing heated gas onto the pattern forming regions. The drying by blowing the heated gas such as hot air does not require a complicated, expensive apparatus, offering a convenient and relatively safe way to dry the pattern forming regions.

According to the invention, a pattern forming apparatus for carrying out the above pattern forming method includes: a cleaning device to clean pattern forming regions on a substrate; and a pattern-material feeding device to feed a pattern forming material to the pattern forming regions cleaned by the cleaning device. The cleaning device includes: a cleaning unit including a cleaner feeding portion to feed a cleaner to the pattern forming region, and a cleaner suction portion disposed in the vicinity of the cleaner feeding portion and operative to suck the cleaner fed onto the pattern forming region; a rinsing unit including a rinsing-fluid feeding portion to feed a rinsing fluid to the pattern forming region cleaned with the cleaner, and a rinsing-fluid suction portion disposed in the vicinity of the rinsing-fluid feeding portion and operative to suck the rinsing fluid fed onto the pattern forming region; and a drying unit to dry the pattern forming region.

In the inventive apparatus thus arranged, the substrate can be selectively cleaned only at the pattern forming regions needing to be cleaned, while the liquid pattern forming material can be selectively fed onto the pattern forming regions. This leads to the savings of resources and energy. Furthermore, the liquid pattern forming material per se forms the pattern and hence, the expensive vacuum equipments are not required. This leads to the downsizing of the apparatus and to the energy saving.

The pattern forming apparatus further includes a control device, which is connected with the cleaning device and the pattern-material feeding device to control the cleaning device and the pattern-material feeding device according to position information of the pattern forming regions to be formed with a pattern. In a case where, for example, a failure circuit component occurs in the course of forming circuit components, a pattern forming region corresponding to the failure component can be inhibited from being cleaned or fed with the liquid pattern forming material. This obviates the cleaning of an unnecessary portion and the feeding of the liquid pattern forming material to such an unwanted portion, thus further saving the resources.

The cleaning device and the pattern-material feeding device may be formed in one piece, such that the cleaning of the pattern forming regions is immediately followed by the feeding of the liquid pattern forming material thereto. This is effective to prevent the cleaned portions from being contaminated with air-borne dusts or the like.

The cleaning unit may include an organic substance cleaning unit to remove organic substances, and an inorganic substance cleaning unit to remove inorganic substances, the organic substance cleaning unit and inorganic substance cleaning unit each including a cleaner feeding portion and a cleaner suction portion. This not only ensures that the pattern forming regions are selectively cleaned in an easy and reliable manner, but also that the organic and inorganic substances constituting the contaminants on the pattern forming regions are positively removed.

The cleaner feeding portion may include a gas nozzle to eject a reactive gas, and a fluid nozzle to eject a fluid capable of dissolving the reactive gas therein. The reactive gas and the fluid capable of dissolving the gas therein may be separately fed whereby the cleaner feeding portion is prevented from being corroded by the cleaner. The drying unit may include a heated-gas outlet port to blow a heated gas onto the pattern forming regions. This provides for an easy drying of the pattern forming regions, which are cleaned and rinsed.

According to the invention, a device fabrication method uses any one of the above mentioned pattern forming methods to clean and remove unwanted substances from a region to be formed with the predetermined pattern and to form the predetermined pattern. This contributes to the savings of resources and energy used to form the pattern in the fabrication of the device, thus resulting in reduced fabrication costs.

A device according to the invention is fabricated using any one of the above mentioned pattern forming methods. The manufacturing costs of the device can thereby be reduced, which enables the device to be offered at a lower cost.

BRIEF DESCRIPTION OF THE DRAWINGS

FIGS. 6(1)-6(4) are schematics of steps of a related art pattern forming method.

DETAILED DESCRIPTION OF PREFERRED EMBODIMENTS

Exemplary embodiments of a pattern forming method and apparatus as well as of a device fabrication method and device according to the invention are described in detail below with reference to the accompanying drawings.

Figure 2:
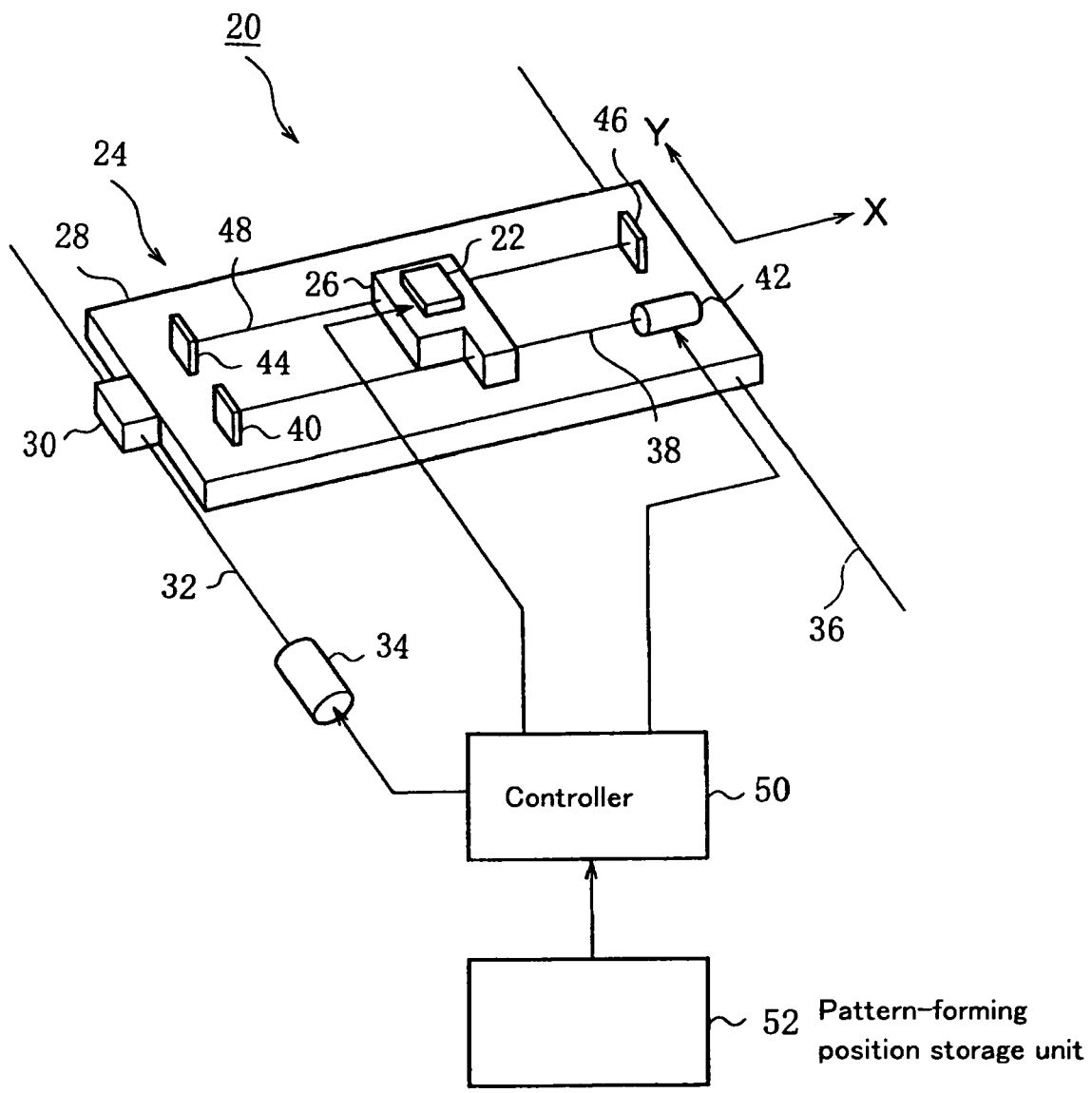
FIG. 2 is a perspective view showing a significant part of the pattern forming apparatus, as viewed from therebelow, according to the first exemplary embodiment.

FIG. 2 is a perspective view showing a significant part of a pattern forming apparatus, as viewed from therebelow, according to a first exemplary embodiment of the invention. Referring to FIG. 2, a pattern forming apparatus 20 includes a cleaning/fluid-feeding head 22, details of which are described below. The cleaning/fluid-feeding head 22 is mounted on a so-called XY-table 24 and movable along a surface of a semiconductor or glass substrate (not shown).

The XY-table 24 includes an X-table 26, and a Y-table 28 carrying thereon the X-table 26. The X-table 26 has the cleaning/fluid-feeding head 22 secured thereto, and a fluid storage portion (not shown), storing a cleaning fluid (cleaner) and a rinsing fluid, mounted thereon. On the other hand, the Y-table 28 is mounted on a Z-table (not shown) and is adapted to move integrally with the Z-table along vertical directions orthogonal to a plane of the Y-table 28. The Y-table 28 has a nut portion 30 disposed at one end thereof and meshed with a ball screw 32.

The ball screw 32 extends along a Y-direction and is rotatably supported at one end thereof by a bracket (not shown) provided at the Z-table. The other end of the ball screw 32 is connected with a Y-servo motor 34 disposed on the Z-table. On the other hand, the other end of the Y-table 28 is slidably penetrated by a guide bar 36 disposed on the Z-table. The guide bar 36 extends in parallel with the ball screw 32. Therefore, the Y-table 28 is moved in the Y-direction along the ball screw 32 when the ball screw 32 is brought into rotation by activating the Y-servo motor 34.

The Y-table 28 is provided with a ball screw 38 extended along an X-direction orthogonal to the ball screw 32. The ball screw 38 is meshed with one side portion of the X-table 26. The ball screw 38 has one end rotatably supported by use of a bearing 40 fixed to the Y-table 28, and the other end thereof connected with an X-servo motor 42 mounted to the Y-table 28. The X-servo motor 42 constitutes a moving device to move the cleaning/fluid-feeding head 22 along the surface of the substrate with the Y-servo motor 34, X-table 26, Y-table 28 and the like.

The Y-table 28 is further provided with a guide bar 48 via brackets 44, 46, the guide bar 48 extending in parallel with the ball screw 38. The guide bar 48 slidably penetrates through one side portion of the X-table 26 thereby guiding the X-table 26 in the X-direction while preventing the X-table 26 from turning. Therefore, the X-table 26 is moved in the X-direction along the ball screw 38 when the ball screw 38 is brought into rotation by activating the X-servo motor 42.

The Y-servo motor 34, X-servo motor 42 and cleaning/fluid-feeding head 22 are connected to a controller 50 as control means, so that these components are controllably operated by the controller 50. The controller 50 is also connected with a pattern-forming position storage unit 52 to store a position of a part to be cleaned. The controller 50 moves the cleaning/fluid-feeding head 22 along the surface of the substrate according to data on the pattern-forming position retrieved from the pattern-forming position storage unit 52. In the meantime, the controller 50 controls the operations of the cleaning/fluid-feeding head 22 for selective cleaning of a predetermined part of the substrate, and feeding of a liquid pattern forming material thereto.

Figure 3:
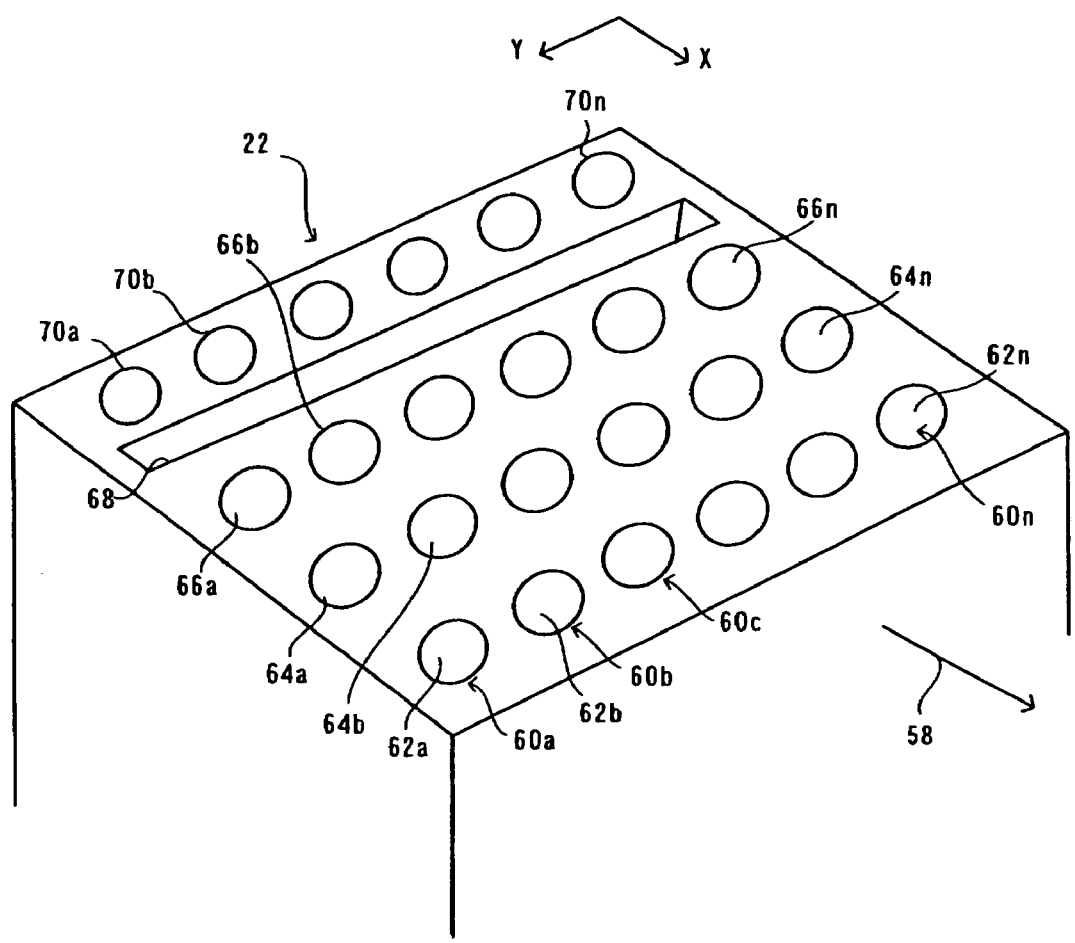
FIG. 3 is a schematic showing the cleaning/fluid-feeding head according to the first exemplary embodiment.

As shown in FIG. 3, the cleaning/fluid-feeding head 22 includes a plurality of cleaning head portions 60 (60a-60n) as a cleaning device. According to the exemplary embodiment, these cleaning head portions 60 are arranged along the Y-direction at regular space intervals. Although FIG. 3 depicts the cleaning/fluid-feeding head 22 including six cleaning head portions, the number of cleaning head portions 60 is not limited to this.

Each of cleaning head portions 60 has an organic substance cleaning unit 62 (62a-62n), an inorganic substance cleaning unit 64 (64a-64n), a rinsing unit 66 (66a-66n) and a drying unit 68, which are individually described in detail below. As indicated by an arrow 58 in FIG. 3, respective lines of the organic substance cleaning units 62, inorganic substance cleaning units 64 and rinsing units 66 are arranged in this order along the X-direction, in which direction the cleaning/fluid-feeding head 22 is moved while cleaning. The cleaning/fluid-feeding head 22 further incorporates therein fluid-feeding head portions 70 (70a-70n) as pattern-material feeding means, which are disposed rearwardly of the cleaning head portions 60 or specifically, disposed rearwardly of the drying unit 68 in corresponding relation with the respective cleaning head portions 60.

Figure 1:
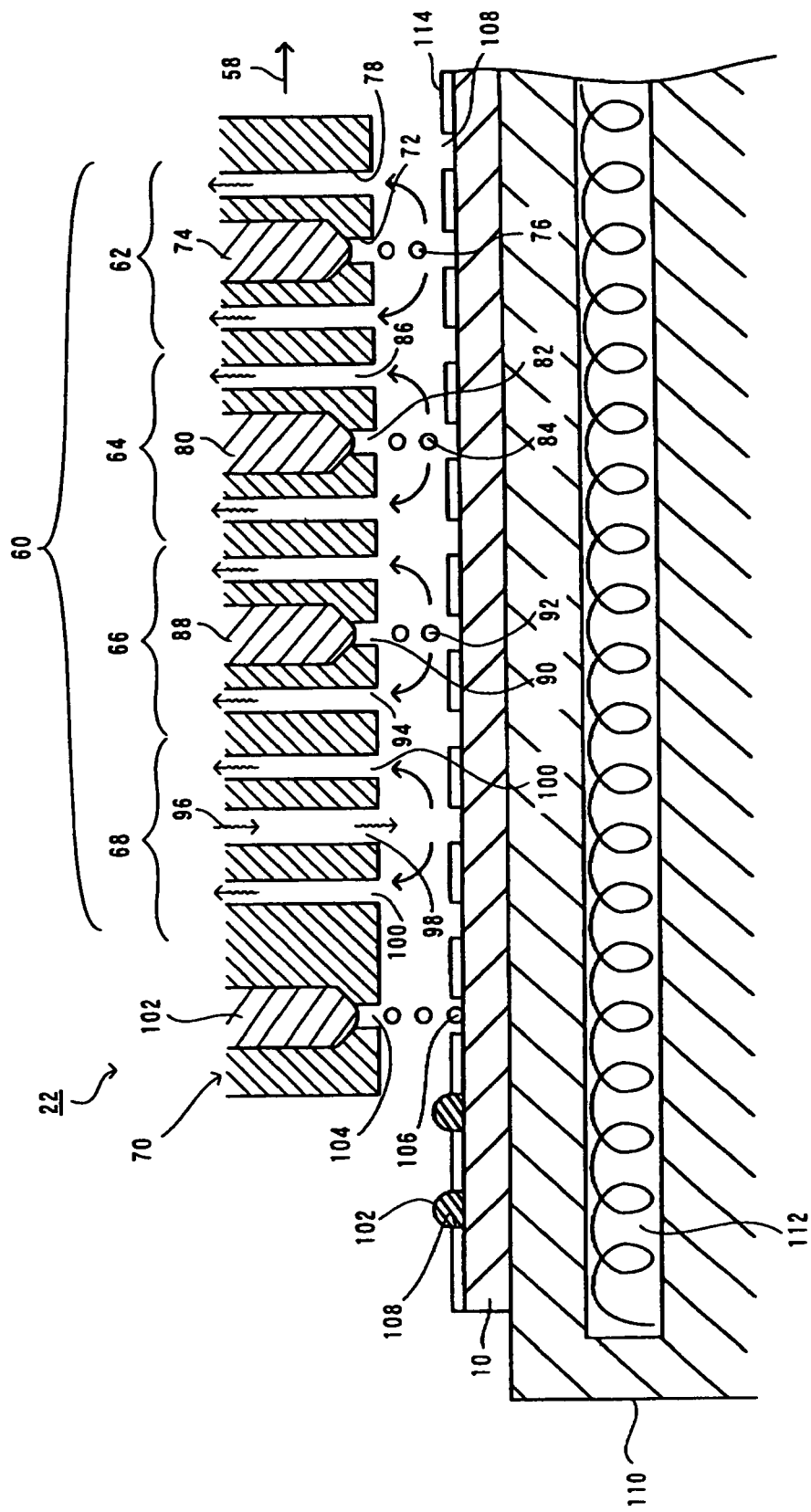
FIG. 1 is a sectional view showing a cleaning/fluid-feeding head of a pattern forming apparatus according to a first exemplary embodiment of the invention.

The organic substance cleaning unit 62, inorganic substance cleaning unit 64, rinsing unit 66, drying unit 68 and fluid-feeding head portion 70 of the cleaning/fluid-feeding head 22 are constructed as shown in FIG. 1. Specifically, the organic substance cleaning unit 62, inorganic substance cleaning unit 64 and rinsing unit 66 have a double pipe structure at a tip thereof. The organic substance cleaning unit 62 includes a first cleaning-fluid nozzle 72 constituting a cleaner feeding portion, thus adapted to eject fine particles 76 of a first cleaning fluid (cleaner) 74, which is an organic-substance releasing fluid or ozone water capable of removing the organic substances, through the first cleaning-fluid nozzle 72 for selectively feeding the first cleaning fluid 74 to a pattern forming region 108 on the substrate 10. The organic substance cleaning unit 62 further includes a first suction port (cleaner suction portion) 78 surrounding the first cleaning-fluid nozzle 72. The first suction port 78 is adapted to suck in products of reaction between the first cleaning fluid 74, sprayed onto a surface of the pattern forming region 108 via the first cleaning-fluid nozzle 72, and the organic substances present on the surface of the substrate 10, as well as the first cleaning fluid 74 evaporated from the surface of the substrate 10.

The inorganic substance cleaning unit 64 includes a second cleaning-fluid nozzle (cleaner feeding portion) 82 to eject a second cleaning fluid (cleaner) 80, such as an aqueous solution of hydrofluoric acid, thus adapted to spray fine particles 84 of the second cleaning fluid 80 onto the pattern forming region 108 on the substrate 10. The inorganic substance cleaning unit 64 further includes a second suction port 86 as a cleaner suction portion, which opens around the second cleaning-fluid nozzle 82 for sucking in products of reaction between the inorganic substances present on the surface of the substrate 10 and the second cleaning fluid 80, as well as the second cleaning fluid 80 evaporated from the surface of the substrate 10.

The rinsing unit 66 includes a rinsing-fluid nozzle (rinsing-fluid feeding portion) 90 to eject pure water 88 as a rinsing fluid, to apply fine particles 92 of the pure water 88 to the pattern forming region 108 on the substrate 10. The rinsing-fluid nozzle 90 is surrounded by a third suction port (rinsing-fluid suction portion) 94 to suck in the vapor of pure water 88 evaporated from the surface of the substrate 10.

According to the exemplary embodiment, fluid ejection mechanisms to eject the fine particles 76, 84, 92 of the first cleaning fluid 74, second cleaning fluid 80 and pure water 88 via the first cleaning-fluid nozzle 72, second cleaning-fluid nozzle 82 and rinsing-fluid nozzle 90 are configured the same way as a print head of an ink-jet printer, thus constructed as regular amount ejecting mechanism capable of ejecting a regular amount of fine particles 76, 84, 92 by way of a piezoelectric element or the like. All the fine particles 76, 84, 92 ejected from the nozzles 72, 82, 90 of the embodiment have a diameter in the range of 10 to 100 μm, so as to be readily evaporated.

The drying unit 68 includes a hot-air outlet port (heated-gas outlet port) 98 to blow hot air 96 as the heated gas onto the substrate 10. The hot-air outlet port 98 is adapted to blow the hot air 96 onto the pattern forming region 108 on the substrate 10 fed with the pure water 88, thereby accelerating the evaporation of the pure water 88 from the pattern forming region 108 to dry the surface thereof. According to the exemplary embodiment, the hot-air outlet port 98 has a rectangular shape, a greater side of which extends along the Y-direction, and in a length to cover an area provided with the cleaning head portions 60, as shown in FIG. 3. Gas suction ports 100 are disposed on both sides of the hot-air outlet port 98 for sucking in the hot air 96 blown out through the hot-air outlet port 98.

The fluid-feeding head portion 70 includes a pattern-material nozzle 104 to eject a liquid pattern forming material 102. The pattern-material nozzle 104 is adapted to eject fine particles 106 of the liquid pattern forming material 102 to selectively feed the pattern forming material to the pattern forming region 108 on the substrate 10 cleaned by the cleaning head portion 60. As in the cleaning head portions 60, an ejection mechanism constituted by the fluid-feeding head portion 70 to feed the liquid pattern forming material 102 is configured in the same way as the print head of the ink-jet printer, thus constructed as regular amount ejecting mechanism. A processing stage 110, on which the substrate 10 is placed, incorporates therein a heater 112 as a heating device, such as to heat the substrate 10 to a predetermined temperature (e.g., 30° C. to 60° C.), thereby accelerating the reaction of the cleaning fluid 74, 80 for removal of the contaminants as well as the evaporation of the cleaning fluid 74, 80 or pure water 88 remaining on the surface of the substrate 10. The fluids used by the invention also include a fluid containing fine particles, such as of a metal.

Referring to FIG. 1, a plurality of pattern forming regions 108 are defined on a top surface of the substrate 10, which is treated to be fluid repellent at peripheries of the pattern forming regions 108. In this exemplary embodiment, the fluid-repellent treatment is accomplished by forming a fluorine resin film 114 repellent to fluid on the surface of the substrate 10. According to the exemplary embodiment, the fluorine resin film 114 is formed by a film forming apparatus as shown in FIG. 4.

Figure 4:
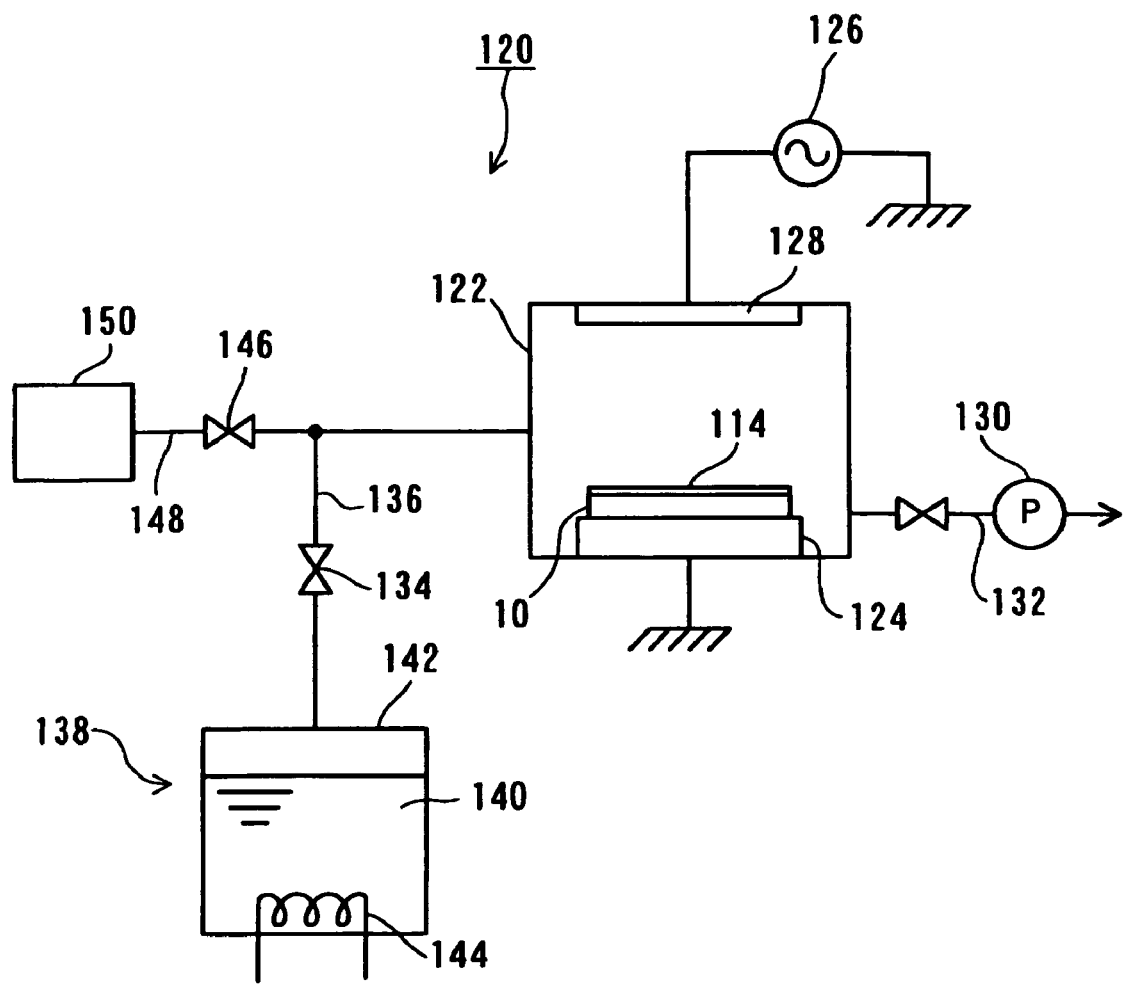
FIG. 4 is a schematic of a film forming apparatus to form a fluid-repellent film according to the exemplary embodiment of the invention.

Referring to FIG. 4, a film forming apparatus 120 includes a film forming chamber 122, in which a film forming stage 124 is provided. The substrate 10, such as a semiconductor substrate or glass substrate, is placed on the film forming stage. The film forming chamber 122 is further provided with a high frequency electrode 128, connected with a high frequency power source 126, at place above the film forming stage 124, the high frequency electrode. The film forming stage 124 is designed to serve as a ground electrode such that a high frequency voltage may be applied between the film forming stage 124 and the high frequency electrode 128. The film forming stage 124 includes a cooling portion (not shown), such as a water cooling coil, such that the substrate 10 placed on the stage may be cooled to accelerate the polymerization of the fluorine resin film 114.

The film forming chamber 122 is connected with a vacuum pump 130 via an exhaust pipe 132 for evacuation of the air in the chamber. The film forming chamber 122 is also connected with a film-material supply portion 138 via a feed pipe 136 equipped with a flow control valve 134. The film-material supply portion 138 includes a vessel 142 to store a liquid fluorine compound 140 of linear PFC such as $C_4F_{10}$ or $C_8F_{18}$. The vessel 142 is provided with a heater 144, which heats the liquid fluorine compound 140 for vaporization. A carrier gas supply portion 150 is connected at place downstream of the flow control valve 134 of the feed pipe 136 via a carrier pipe 148 equipped with a flow control valve 146. An inert gas, such as nitrogen gas or argon gas, is used as the carrier gas. Particularly preferred is the argon gas capable of facilitating electric discharge.

When the fluorine resin film 114 is to be formed by the film forming apparatus 120, the substrate 10 is placed on the film forming stage 124. Subsequently, the air in the film forming chamber 122 is evacuated by means of the vacuum pump 130 and then, the vapor of the liquid fluorine compound 140 along with the carrier gas are introduced into the film forming chamber 122. The high frequency power source 126 applies a high frequency voltage between the high frequency electrode 128 and the film forming stage 124, thereby producing gaseous discharge to ionize the vapor of the liquid fluorine compound 140. The ionized liquid fluorine compound 140 is polymerized on the surface of the substrate 10 to form the fluid-repellent fluorine resin 114.

The thus arranged pattern forming apparatus 20 of this exemplary embodiment performs the following procedure to form a pattern. Firstly, the film forming apparatus 120, shown in FIG. 4, is operated as described above to overlay the fluorine resin film 114 on the overall surface of the substrate 10 to be formed with a pattern thereon. Subsequently, a mask (not shown) is placed atop or above the fluorine resin film 114, the mask including openings in corresponding to regions of the substrate 10, which are formed with the pattern. The fluorine resin film 114 is exposed to ultraviolet rays via the mask, so that portions of the fluorine resin film 114 which correspond to the openings of the mask are decomposed and vaporized by the ultraviolet rays. Thus, the pattern forming regions 108 are exposed on the substrate 10, as shown in FIG. 1. In addition, the pattern forming regions 108 become lyophilic as a result of the exposure to the ultraviolet rays which decompose the organic substances adhered on the substrate 10.

The substrate 10 with the fluorine resin film 114 removed from the pattern forming regions 108 is placed on the processing stage 110 of the pattern forming apparatus 20 while heated to the predetermined temperature of 30 to 60° C., for example, by the heater 112 incorporated in the processing stage 110. On the other hand, positions to form a pattern on the substrate 10, that is the positions of the pattern forming regions 108 for forming circuit components and wires are inputted to the pattern-forming position storage unit 52 of the pattern forming apparatus 20.

When the pattern forming apparatus 20 is activated and receives a pattern forming command, the controller 50 drives the Y-servo motor 34 and the X-servo motor 42 to move the cleaning/fluid-feeding head 22 to a predetermined initial position by use of the XY-table 24. Then, the controller 50 retrieves position data of the pattern forming regions 108 to define the pattern from the pattern-forming position storage unit 52, so as to drive the X-servo motor 42 to move the cleaning/fluid-feeding head 22 along the X-direction as indicated by the arrow 58 in FIG. 3, thereby aligning the organic substance cleaning units 62 constituting the cleaning head portions 60 of the cleaning/fluid-feeding head 22 with first pattern forming regions 108 on the substrate 10. Then, the controller 50 causes the first cleaning-fluid nozzles 72 to eject the fine particles 76 of the first cleaning fluid 74, such as a releasing fluid or ozone water, thereby selectively feeding the fluid to the pattern forming regions 108 on the substrate 10. At this time, the controller 50 inhibits the ejection of the first cleaning fluid 74 from an organic substance cleaning unit 62, which does not correspond to the pattern forming region 108 on the substrate 10. Therefore, the substrate 10 is cleaned only at the pattern forming regions 108 needing to be cleaned for pattern formation, but not at a pattern forming region 108 corresponding to a failure component occurred in the course of forming circuit components, for example, because such a region is not formed with the pattern and thence, does not need cleaning.

The fine particles 76 of the first cleaning fluid 74 fed onto the pattern forming regions 108 on the substrate 10 release the organic substances present on the surface of the pattern forming regions 108, or react with the organic substances to oxidize and gasify the same. On the other hand, the first cleaning fluid 74 as liquid remaining on the surface of the substrate 10 is evaporated by the heat from the substrate 10 heated by the heater 112. The organic substances released from the surface of the pattern forming regions 108, the products of reaction between the first cleaning fluid 74 and the organic substances, and the vaporized first cleaning fluid 74 are sucked into the first suction ports 78, thus removed from the surface of the pattern forming regions 108 and their peripheries. In addition, the embodiment permits the substrate 10 to be heated to the predetermined temperature by the heater 112 incorporated in the table 110, so that the separation of the organic substances, the reaction between the organic substances and the first cleaning fluid 74 and the evaporation of the first cleaning fluid 74 remaining on the surface of the substrate 10 are accelerated. This speeds up the cleaning process while eliminating influence on the subsequent step of cleaning the inorganic substances.

In a case where the substrate 10 has such a wide area to be cleaned that the cleaning/fluid-feeding head 22 need be moved in the Y-direction, the controller 50 drives the Y-servo motor 34 to move the cleaning/fluid-feeding head 22 in the Y-direction by use of the Y-table 28.

After the lapse of a predetermined period of time during which the organic substance cleaning units 62 are operated to remove the organic substances, the controller 50 causes the cleaning/fluid-feeding head 22 to be moved along the X-direction to align the inorganic substance cleaning units 64 with the pattern forming regions 108 on the substrate 10 that are cleaned of the organic substances by the organic substance cleaning units 62. Subsequently, the controller 50 activates the fluid ejection mechanism (not illustrated) of the inorganic substance cleaning units 64 to eject the fine particles 84 of the second cleaning fluid 80 through the second cleaning nozzles 82, thereby selectively feeding the fluid to the pattern forming regions 108 on the substrate 10 that are cleaned of the organic substances. The second cleaning fluid 80 reacts with the contaminants of inorganic substances adhered to the surfaces of the pattern forming regions 108 so as to etch away the contaminants. The products of the reaction between the second cleaning fluid 80 and the inorganic substances, and the vapor of second cleaning fluid 80 evaporated from the surface of substrate 10 are sucked in the second suction port 86. The controller 50 does not activate an inorganic substance cleaning unit 64 corresponding to the organic substance cleaning unit 62 disabled to eject the first cleaning fluid 74. That is, only the pattern forming regions 108 cleaned of the organic substances are subjected to the cleaning by the inorganic substance cleaning units 64.

After the lapse of a predetermined period of time during which the inorganic substance cleaning units 64 are operated to clean and remove the inorganic substances, the controller 50 moves the cleaning/fluid-feeding head 22 further along the X-direction to align the rinsing units 66 with the position corresponding to pattern forming regions 108, which are cleaned of the inorganic substances by the inorganic substance cleaning units 64. Subsequently, the controller 50 activates the fluid ejection mechanism of the rinsing units 66 to feed the pure water 88 to the pattern forming regions 108 on the substrate 10, thereby rinsing the pattern forming regions 108 cleaned of the inorganic substances. The pure water 88 fed as the fine particles 92 to the pattern forming regions 108 are evaporated due to the heat from the heated substrate 10, while sucked in the third suction ports 94 provided around the rinsing-fluid nozzles 90.

When the rinsing with the pure water 88 is completed, the controller 50 moves the cleaning/fluid-feeding head 22 further along the X-direction for aligning the hot-air outlet port 98 of the drying unit 68 with the pattern forming regions 108 thus rinsed. The hot air 96 is blown onto the rinsed pattern forming regions 108 via the hot-air outlet port 98 thereby completely drying the surfaces of the pattern forming regions 108. This accomplishes the cleaning of the pattern forming regions 108. In the exemplary embodiment, the hot air 96 blown onto the pattern forming regions 108 is sucked in the gas suction ports 100 provided on the both sides of the hot-air outlet port 98, so as not to affect the feeding of the liquid pattern forming material 102 to the pattern forming regions 108 by the fluid-feeding head portions 70.

An alternative arrangement may be made such that when the hot air 96 is applied to provide drying, the pattern forming regions 108 subjected to the hot air 96 may be exposed to the ultraviolet rays or a hot air 96 admixed with ozone in order to remove the organic substances remaining thereon. In addition, the drying process may also be performed by irradiating infrared rays.

When the cleaning and drying of the pattern forming regions 108 are completed, the controller 50 moves the cleaning/fluid-feeding head 22 further along the X-direction, thereby moving the fluid-feeding head portions 70 of the cleaning/fluid-feeding head 22 above the cleaned pattern forming regions 108. Then, the controller 50 activates the fluid ejection mechanism (not illustrated) of the fluid-feeding head portion 70, which ejects the fine particles 106 of the liquid pattern forming material 102 through the pattern-material nozzles 104, thereby selectively feeding the liquid pattern forming material 102 to the cleaned pattern forming regions 108.

After pattern forming regions 108 are all cleaned, and supplied with the liquid pattern forming material 102 with respect to the predetermined width in the X-direction of the substrate 10 (an effective width of the cleaning/fluid-feeding head 22), the controller 50 shifts the cleaning/fluid-feeding head 22 in the Y-direction by a predetermined quantity and returns the head to a cleaning start position to carry out the same steps as the above to clean and feed the liquid pattern forming material 102 to pattern forming regions 108 on the substrate 10.

When all the pattern forming regions 108 on the substrate 10 are supplied with the liquid pattern forming material 102 in this manner, the substrate 10 is conveyed into a furnace, for example, wherein the substrate is heated to a predetermined temperature for setting the liquid pattern forming material 102 thereon. In this manner, a desired pattern may be accomplished by selectively cleaning the regions of the substrate 10 to be formed with a pattern and by feeding the pattern forming material 102 to the regions.

This results in notably reduced consumptions of the cleaning fluid (cleaner), rinsing fluid (pure water) and pattern forming material as well as in a notably reduced energy consumption. Furthermore, the pattern forming regions 108 can be cleaned and supplied with the liquid pattern forming material 102 without moving the substrate 10, which allows for the downsizing of the equipment. In addition, the arrangement is made such that the cleaning of the pattern forming regions 108 is immediately followed by the feeding of the liquid pattern forming material 102 thereto, so that the concern of contamination of the pattern forming regions 108 is eliminated. This leads to the enhancement of the pattern quality. The exemplary embodiment permits the pattern to be formed simply by thermally setting the liquid pattern forming material 102, thus obviating the vacuum equipment. Consequently, the equipment and running costs are dramatically decreased.

The setting of the liquid pattern forming material 102 may be accomplished by irradiation of ultraviolet rays, electromagnetic waves such as gamma rays, or corpuscular rays such as electron beams, depending on the type of the pattern forming material.

Figure 5:
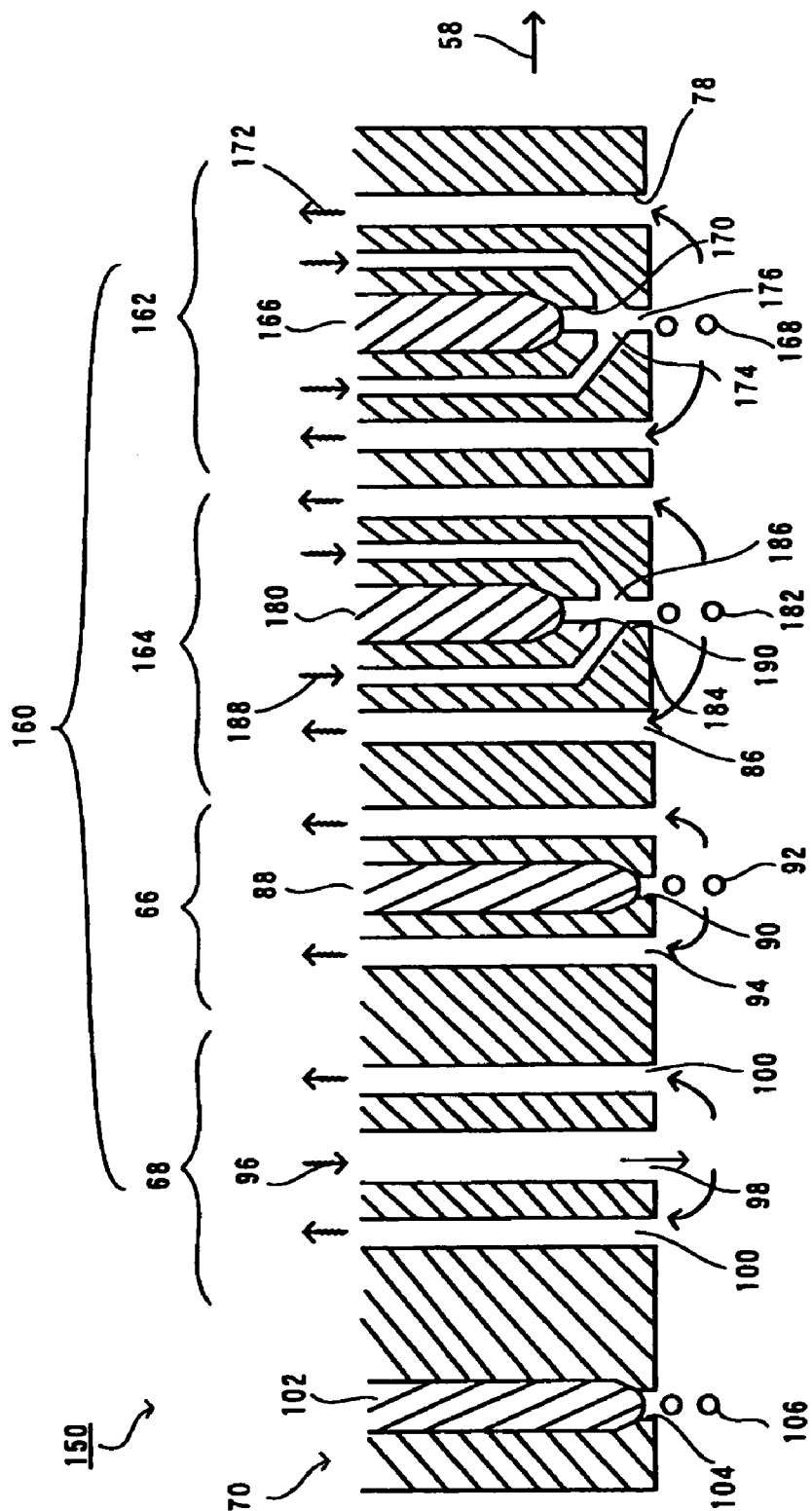
FIG. 5 is a sectional view showing a cleaning/fluid-feeding head according to a second exemplary embodiment of the invention.

FIG. 5 is a sectional view of a cleaning/fluid-feeding head illustrating a principal part of a second exemplary embodiment of the invention. Similarly to the first exemplary embodiment, a cleaning/fluid-feeding head 150 according to the second exemplary embodiment includes cleaning head portions 160 and the fluid-feeding head portions 70. The cleaning head portion 160 includes an organic substance cleaning unit 162, an inorganic substance cleaning unit 164, the rinsing unit 66 and the drying unit 68. The cleaning/fluid-feeding head 150 differs from the first exemplary embodiment in the configurations of the organic substance cleaning unit 162 and the inorganic substance cleaning unit 164, while the rinsing unit 66 and the drying unit 68 of the cleaning head portion 160 and the fluid-feeding head portion 70 are configured the same way as in the first embodiment. Specifically, the organic substance cleaning unit 162 and the inorganic substance cleaning unit 164 of the second exemplary embodiment have a triple pipe structure at a tip thereof.

The organic substance cleaning unit 162 includes a first fluid nozzle 170 centrally disposed and operative to eject fine particles 168 of a first solution 166, such as pure water. The organic substance cleaning unit 162 further includes a first gas nozzle 174 to eject a first reactive gas 172, such as ozone capable of oxidizing the organic substances for gasification and soluble in the first solution 166, around the first fluid nozzle 170. The first gas nozzle 174 opens to a tip end of the first fluid nozzle 170. The first gas nozzle 174 is provided with a first outlet port 176 at its tip, through which the fine particles 168 of the first solution 166 and the first reactive gas 172 are fed onto a pattern forming region 108 on the substrate 10 not shown in the figure. The first outlet port 176 is surrounded by the first suction port 78, such that the reaction products and the vaporized first solution 166 may be removed by sucking.

The inorganic substance cleaning unit 164 is configured the same way as the organic substance cleaning unit 162. The inorganic substance cleaning unit includes a second fluid nozzle 184 centrally disposed and operative to eject fine particles 182 of a second solution 180. The second fluid nozzle 184 is surrounded by a second gas nozzle 186 adapted to eject a second reactive gas 188 toward a tip of the second fluid nozzle 184, the second gas including HF or $Cl_2$ which is reactive with the inorganic substances and soluble in the second solution 180. The second gas nozzle 186 is provided with a second outlet port 190 at its tip, such that the fine particles 182 of the second solution 180 and the second reactive gas 188 may be sprayed onto the pattern forming region 108. Furthermore, the second outlet port 190 is surrounded by the second suction port 86 for sucking in the reaction products and the vaporized second solution 180.

According to the exemplary embodiment, ejection mechanisms constituted by the first fluid nozzle 170 and the second fluid nozzle 184 are configured the same way as the print head of the ink-jet printer, thus constructed as regular amount ejecting mechanism capable of ejecting a regular amount of fine particles 168, 182 by way of a piezoelectric element or the like.

In the second exemplary embodiment thus arranged, the controller 50 (not shown) moves the organic substance cleaning units 162 of the cleaning/fluid-feeding head 22 above the pattern forming regions 108 on the substrate 10 by use of the XY-table 24. Then, the controller 50 controls the ejection mechanism for the first fluid nozzles 170, which eject the fine particles 168 of the first solution 166, such as pure water. In the meantime, the controller 50 opens an on-off valve (not illustrated) to allow the first gas nozzles 174 to eject the first reactive gas 172, such as ozone. The fine particles 168 of the first solution 166 ejected from the first fluid nozzles 170 impinge upon the pattern forming regions 108 while dissolving a part of the first reactive gas 172 therein. Thus, the first reactive gas 172 is activated through ionization so as to react with the organic substances on the surfaces of the pattern forming regions 108. Then, the resultant reaction products and the vaporized first solution 166 are sucked through the first suction port 78, thus removed from the surface of the substrate 10.

When the organic substance cleaning units 162 complete the cleaning of the organic substances, the controller 50 moves the cleaning/fluid-feeding head 150 as indicated by the arrow 58, thereby aligning the inorganic substance cleaning units 164 with the position corresponding to the pattern forming regions 108 cleaned of the organic substances. The controller 50 causes the second fluid nozzles 184 to eject the fine particles 182 of the second solution 180, such as pure water or alcohol, while permitting the second gas nozzles 186 to eject the second reactive gas 188, such as HF. The fine particles 182 of the second solution 180 dissolves a part of the second reactive gas 188 therein. The fine particles 182 and the second reactive gas 188 are ejected from the second outlet port 190 to impinge upon the surfaces of the pattern forming regions 108. In this process, the second reactive gas 188 is dissolved in the fine particles 182 to be ionized, so as to etch away the inorganic substances present on the surfaces of the pattern forming regions 108. The products of the etching reaction and the vaporized second solution 180, as well as the unreacted second reactive gas 188, are removed by sucking through the second suction port 86.

After the cleaning of the organic and inorganic substances is completed, the rinsing units 66 and the drying unit 68 carry out the rinsing step and the drying step the same way as described above. The pattern forming regions 108 thus cleaned, rinsed and dried are supplied with the liquid pattern forming material 102 from the fluid-feeding head portions 70.

Although the above exemplary embodiment illustrates the example where the reactive gas 172, 188 is ejected from the portion surrounding the fluid nozzle 170, 184, the reactive gas 172, 188 may be ejected from one side of the fluid nozzle 170, 184. It is preferred that the tip portion of the cleaning/fluid-feeding head 22, 150 is covered with a fluorine resin film to protect the tip portion against corrosion by the cleaner or the reacted products. Although the foregoing exemplary embodiments illustrate the cleaning head portion 60, 160 and the fluid-feeding head portion 70 are formed in one piece, these components may be formed separately.

The pattern forming method and apparatus of the invention are applicable to a method of fabricating a device such as a color filter, organic EL (electro luminescence) device or the like, or to the formation of metal wirings on the substrate. More specifically, the invention may preferably be used to form a color filter or an EL device at a predetermined place on the substrate by applying an ink for color filter or an organic EL material thereto.

[Advantages of the Invention]

As mentioned supra, the invention permits only selected pattern forming regions on the substrate to be cleaned and supplied with the liquid pattern forming material, and hence contributes to the savings of resources and energy.

The invention claimed is:

1. A pattern forming apparatus, comprising:
    a cleaning device to clean pattern forming regions on a substrate; and
    a pattern-material feeding device to feed a pattern forming material to the pattern forming regions cleaned by the cleaning device;
    the cleaning device including:
    cleaning unit including a first group of nozzles comprising:
        cleaner feeding portion to feed a cleaner including a first solution and a second solution to the pattern forming regions on the substrate, the cleaner feeding portion releasing a first solution that causes a first chemical reaction with organic substances and separately releasing a second solution that causes a second chemical reaction with inorganic substances, and
        a cleaner suction portion disposed in the vicinity of the cleaner feeding portion and operative to separately suck at least products of the first and second chemical reactions from the pattern forming regions;
    a rinsing unit including a rinsing-fluid feeding portion to feed a rinsing fluid onto the pattern forming regions cleaned with the cleaner, and a rinsing-fluid suction portion disposed in the vicinity of the rinsing-fluid feeding portion and operative to suck the rinsing fluid fed onto the pattern forming regions; and
    a drying unit to dry the pattern forming region.

2. The pattern forming apparatus as claimed in claim 1, further including a control device that controls the cleaning device and the pattern-material feeding device according to position information of the pattern forming regions to be formed with a pattern.

3. The pattern forming apparatus as claimed in claim 1, the cleaning device and the pattern-material feeding device being formed in one piece.

4. The pattern forming apparatus as claimed in claim 1, the cleaning unit including the first group of nozzles comprising an organic substance cleaning unit to remove the organic substances, and an inorganic substance cleaning unit to remove the inorganic substances.

5. The pattern forming apparatus as claimed in claim 1, the cleaner feeding portion including a gas nozzle to eject a reactive gas, and a fluid nozzle to eject a fluid capable of dissolving the reactive gas therein.

6. The pattern forming apparatus as claimed in claim 1, the drying unit including a heated-gas outlet port to blow heated gas onto the pattern forming regions.

* * * * *